US010921389B2

(12) United States Patent
Klein et al.

(10) Patent No.: US 10,921,389 B2
(45) Date of Patent: Feb. 16, 2021

(54) PLANAR HALL EFFECT SENSORS

(71) Applicants: BAR ILAN UNIVERSITY, Ramat Gan (IL); B. G. Negev Technologies and Applications Ltd. at Ben-Gurion University, Beer Sheva (IL)

(72) Inventors: Lior Klein, Ramat Gan (IL); Mordechai Schultz, Holon (IL); Vladislav Mor, Holon (IL); Asaf Grosz, Ramat Gan (IL); Shai Amrusi, Netivot (IL); Igor Faivinov, Be'er Sheva (IL)

(73) Assignees: BAR-ILAN UNIVERSITY, Ramat Gan (IL); B. G. Negev Technologies and Applications Ltd., at Ben-Gurion University, Beer-Sheva (IL)

( * ) Notice: Subject to any disclaimer, the term of this patent is extended or adjusted under 35 U.S.C. 154(b) by 141 days.

(21) Appl. No.: 16/019,560

(22) Filed: Jun. 27, 2018

(65) Prior Publication Data
US 2020/0003850 A1    Jan. 2, 2020

(51) Int. Cl.
*G01R 33/07*    (2006.01)
*G01R 15/20*    (2006.01)
(Continued)

(52) U.S. Cl.
CPC .......... *G01R 33/07* (2013.01); *G01R 15/202* (2013.01); *H01L 43/04* (2013.01); *H01L 43/06* (2013.01)

(58) Field of Classification Search
CPC .. B64G 1/366; G01R 33/0206; G01R 33/028; G01R 33/038; G01R 33/1215
See application file for complete search history.

(56) References Cited

U.S. PATENT DOCUMENTS 6,191,581 B1 *   2/2001   Van Dau ............ G01R 33/09
                                                     324/249
7,684,147 B2     3/2010   Ahn et al.
(Continued)

FOREIGN PATENT DOCUMENTS

NL          8303305         4/1985

OTHER PUBLICATIONS

A. Grosz, V. Mor, S. Amrusi, I. Faivinov, E. Paperno and L. Klein, "A High-Resolution Planar Hall Effect Magnetometer for Ultra-Low Frequencies," in IEEE Sensors Journal, vol. 16, No. 9, pp. 3224-3230, May 1, 2016. doi: 10.1109/JSEN.2016.2523463.
(Continued)

*Primary Examiner* — Tung X Nguyen
(74) *Attorney, Agent, or Firm* — Pearl Cohen Zedek Latzer Baratz LLP

(57) ABSTRACT

A planar Hall effect (PHE) sensor for measuring at an external magnetic field includes a plurality of elongated magnetic regions. Each magnetic region includes a ferromagnetic material that is magnetized along a longitudinal axis. The magnetic regions cross one another at an overlap region that is characterized by a plurality of easy magnetic axes. At least two pairs of electrical leads are each aligned along one of the easy magnetic axes. A current source may be connected to a first pair of the electrical leads to cause a current to flow through the overlap region along a first easy magnetic axis. A voltage measurement device may be connected to another pair of the electrical leads to measure a PHE voltage that is generated by a component of the external magnetic field that is perpendicular to the easy magnetic axis along which the overlap region is magnetized.

13 Claims, 6 Drawing Sheets

(51) Int. Cl.
    *H01L 43/04*        (2006.01)
    *H01L 43/06*        (2006.01)

(56) References Cited

U.S. PATENT DOCUMENTS

| | | | |
|---|---|---|---|
| 8,466,526 B2 * | 6/2013 | Hioka | H01L 43/065 |
| | | | 257/421 |
| 2004/0700380 | 4/2004 | Tang et al. | |
| 2014/2470430 | 9/2014 | Klein et al. | |

OTHER PUBLICATIONS

Qejvanaj, Fatjon. "Fabrication and Characterization of magnetometer for space applications" 2016. PhD Thesis. KTH Royal Institute of Technology. Qejvanaj, Fatjon, Dec. 31, 2016.

Zhang X. Hall Effect Measurements: Hall Bar and Van der Pauw Geometry, Retrieved form URL <https://xiaoshanxu.unl.edu/system/files/sites/unl.edu.cas.physics. University of Nebraka-Linciln, May 20, 2016.

International Search report for Application No. PCT/IL2019/050705, dated Oct. 7, 2019.

* cited by examiner

PLANAR HALL EFFECT SENSORS

FIELD OF THE INVENTION

The present invention relates to magnetic field sensors. More particularly, the present invention relates to planar Hall effect sensors.

BACKGROUND OF THE INVENTION

The operation of a planar Hall effect (PHE) sensor is based on a piece of a suitable ferromagnetic material exhibiting an easy magnetic axis of magnetization and exhibiting anisotropic magnetoresistance. Without an applied magnetic field, the magnetization of the sensor lies along the easy magnetic axis. When a magnetic field is applied with a component in the plane of the PHE sensor and perpendicular to the easy magnetic axis, the magnetization of the sensor rotates away from the easy magnetic axis. When in operation, an electrical current is flowing through the sensor along one axis. A transverse voltage across the material, known as the planar Hall effect voltage, is measured along another, perpendicular, axis in the plane of the material. The transverse resistance, defined as the transverse voltage divided by the current, varies approximately linearly with the angle between the applied current and the magnetization of the material, in the limit of small angles. Since the angle varies linearly with the strength of the perpendicular component of the external field, in the limit of small fields, the planar Hall voltage varies linearly with the perpendicular component of the external applied field. Thus, a sensor based on PHE may be utilized to measure the external magnetic field.

SUMMARY OF THE INVENTION

There is thus provided, in accordance with an embodiment of the present invention, a planar Hall effect (PHE) sensor for measuring at least one component of an external magnetic field, the sensor including: a plurality of elongated magnetic regions, each elongated magnetic region including a ferromagnetic material that is magnetized, in the absence of the external magnetic field, along a longitudinal axis along the elongated dimension of the elongated magnetic region, the plurality of elongated magnetic regions crossing one another at an overlap region, the overlap region being characterized by a plurality of easy magnetic axes; at least two pairs of electrical leads, each of the pairs being aligned along one easy magnetic axis of the plurality of easy magnetic axes; a current source that, when connected to a first pair of the at least two electrical leads, is operable to cause a current to flow through the overlap region along a first easy magnetic axis with which the first pair is aligned; and a voltage measurement device, when connected to electrical leads of at least one other pair of said at least two electrical leads and when the current flows through the overlap region along the first easy magnetic axis, configured to measure a PHE voltage that is generated by a component of the external magnetic field that is perpendicular to the easy magnetic axis along which the overlap region is magnetized.

Furthermore, in accordance with an embodiment of the present invention, the plurality of elongated magnetic regions cross one another at a midpoint of the longitudinal axis of each of the plurality of elongated magnetic regions.

Furthermore, in accordance with an embodiment of the present invention, the plurality of elongated magnetic regions includes two magnetic regions whose longitudinal axes are substantially perpendicular to one another.

Furthermore, in accordance with an embodiment of the present invention, the at least two pairs of electrical leads are each aligned with an easy magnetic axis along a different diagonal between the perpendicular longitudinal axes.

Furthermore, in accordance with an embodiment of the present invention, the plurality of elongated magnetic regions includes three magnetic regions such that the longitudinal axis of each elongated magnetic region is rotated by substantially equal angles from the longitudinal axes of each of the other two elongated magnetic regions.

Furthermore, in accordance with an embodiment of the present invention, the at least two pairs of electrical leads are each aligned along the longitudinal axis of a different elongated magnetic region of each of the plurality of elongated magnetic regions.

Furthermore, in accordance with an embodiment of the present invention, each of the plurality of elongated magnetic regions is elliptical, the longitudinal axis of each of the plurality of elongated magnetic regions being the major axis of that elongated magnetic region.

Furthermore, in accordance with an embodiment of the present invention, the sensor includes a mechanism for changing an orientation of the magnetization of the overlap region from along one easy magnetic axis of said plurality of easy magnetic axes to another easy magnetic axis of said plurality of easy magnetic axes.

Furthermore, in accordance with an embodiment of the present invention, the mechanism includes an electrical conductor that is perpendicular to the longitudinal axis of one of the plurality of elongated magnetic regions.

There is further provided, in accordance with an embodiment of the present invention, a planar Hall effect (PHE) sensor for measuring at least one component of an external magnetic field, the sensor including: an array of a plurality of elongated magnetic regions, each elongated magnetic region including a ferromagnetic material that is magnetized, in the absence of the external magnetic field, along a longitudinal axis along the elongated dimension of the elongated magnetic region, the longitudinal axes of the plurality of elongated magnetic regions being substantially parallel to one another and laterally displaced from one another, each of the plurality of elongated magnetic regions being connected by an electrical conductor to each adjacent elongated magnetic region of the array; two longitudinal electrical leads, each longitudinal electrical lead connected in common to one end along the longitudinal axis of each elongated magnetic region of the array such that the plurality of elongated magnetic regions are connected in parallel to each of the longitudinal electrical leads; two lateral electrical leads connected to each of two outside elongated magnetic regions of the array along a lateral axis that is substantially perpendicular to the longitudinal axes such that the plurality of elongated magnetic regions are connected in series to the two lateral electrical leads; a current source that, when connected to a first pair of leads of either the two longitudinal electrical leads or the two lateral electrical leads, is operable to cause a current to flow through the plurality of elongated magnetic regions along the longitudinal axis; and a voltage measurement device configured to, when connected to another pair of leads of the two longitudinal electrical leads or the two lateral electrical leads and when the current flows through the plurality of elongated magnetic regions between the first pair of leads, measure a PHE voltage that is generated by a component of the external magnetic field that is perpendicular to the longitudinal axis.

Furthermore, in accordance with an embodiment of the present invention, each elongated magnetic region of the array is elliptical, the longitudinal axis of the elongated magnetic region being the major axis of that elongated magnetic region.

Furthermore, in accordance with an embodiment of the present invention, the displacements between adjacent elongated magnetic regions of the array are substantially equal.

There is further provided, in accordance with an embodiment of the present invention, a planar Hall effect (PHE) sensor for measuring at least one component of an external magnetic field, the sensor including: an elongated magnetic region including a ferromagnetic material that is magnetized, in the absence of the external magnetic field, along a longitudinal axis along the elongated dimension of the elongated magnetic region; two longitudinal electrical leads, each longitudinal electrical lead connected to an end of the elongated magnetic region along the longitudinal axis; a plurality of pairs of lateral electrical leads, the lateral electrical leads of each of the pairs connected to a side of elongated magnetic region along a lateral axis that is substantially perpendicular to the longitudinal axis, each pair of the plurality of pairs being longitudinally displaced from other pairs of the plurality of pairs; a current source that is connectable to the longitudinal electrical leads and that is operable to cause a current to flow through the elongated magnetic region along the longitudinal axis; and a voltage measurement device configured to, when connected to a pair of the plurality of pairs and when the current flows along the longitudinal axis, measure a PHE voltage that is generated by a component of the external magnetic field that is perpendicular to the longitudinal axis at a region of the elongated magnetic region between the lateral electrical leads of that pair.

Furthermore, in accordance with an embodiment of the present invention, the elongated magnetic region is elliptical, the longitudinal axis being the major axis of the elongated magnetic region.

Furthermore, in accordance with an embodiment of the present invention, longitudinal displacements between adjacent pairs of the plurality of pairs are substantially equal.

Furthermore, in accordance with an embodiment of the present invention, the sensor includes one or more additional voltage measurement devices such two or more of the voltage measurement devices are configured to concurrently measure voltages between two or more pairs of the plurality of pairs.

There is further provided, in accordance with an embodiment of the present invention, a planar Hall effect (PHE) sensor for measuring at least one component of an external magnetic field, the sensor including: an elongated magnetic region including a ferromagnetic material that is magnetized, in the absence of the external magnetic field, along a longitudinal axis along the elongated dimension of the elongated magnetic region; two longitudinal electrical leads, each longitudinal electrical lead connected to an end of the elongated magnetic region along the longitudinal axis; two lateral electrical leads, each lateral electrical lead connected to a side of elongated magnetic region along a lateral axis that is substantially perpendicular to the longitudinal axis; a current source that, when connected to a first pair of leads of either the two longitudinal electrical leads or the two lateral electrical leads, is operable to cause a current to flow through the elongated magnetic region along an axis of the first pair of leads; two magnetic flux concentrators positioned on opposite sides of the elongated magnetic region, each magnetic flux concentrator including a ferromagnetic material, proximal faces of the magnetic flux concentrators being positioned such that magnetic flux crosses the elongated magnetic region from one of the magnetic flux concentrators to the other in a direction that is substantial perpendicular to the longitudinal axis; and a voltage measurement device configured to, when connected another pair of leads of either the two longitudinal electrical leads or the two lateral electrical leads, and when the current flows through the first pair of leads, measure a PHE voltage that is generated by a component of the external magnetic field that is perpendicular to axis of the current and whose magnetic flux is concentrated by the magnetic flux concentrators.

Furthermore, in accordance with an embodiment of the present invention, the elongated magnetic region is elliptical, the longitudinal axis being the major axis of the elongated magnetic region.

Furthermore, in accordance with an embodiment of the present invention, the magnetic flux concentrator is configured to cause flux that is parallel to the longitudinal axis at a distal face of the magnetic flux concentrator to be directed perpendicular to the longitudinal axis at the proximal face of the magnetic flux concentrator.

Furthermore, in accordance with an embodiment of the present invention, the magnetic flux concentrator is configured to cause flux that is perpendicular to both the longitudinal axis and that lateral axis at a distal face of the magnetic flux concentrator to be directed perpendicular to the longitudinal axis and parallel to the lateral axis at the proximal face of the magnetic flux concentrator.

BRIEF DESCRIPTION OF THE DRAWINGS

In order for the present invention, to be better understood and for its practical applications to be appreciated, the following Figures are provided and referenced hereafter. It should be noted that the Figures are given as examples only and in no way limit the scope of the invention. Like components are denoted by like reference numerals.

DETAILED DESCRIPTION OF THE INVENTION

Figure 1:
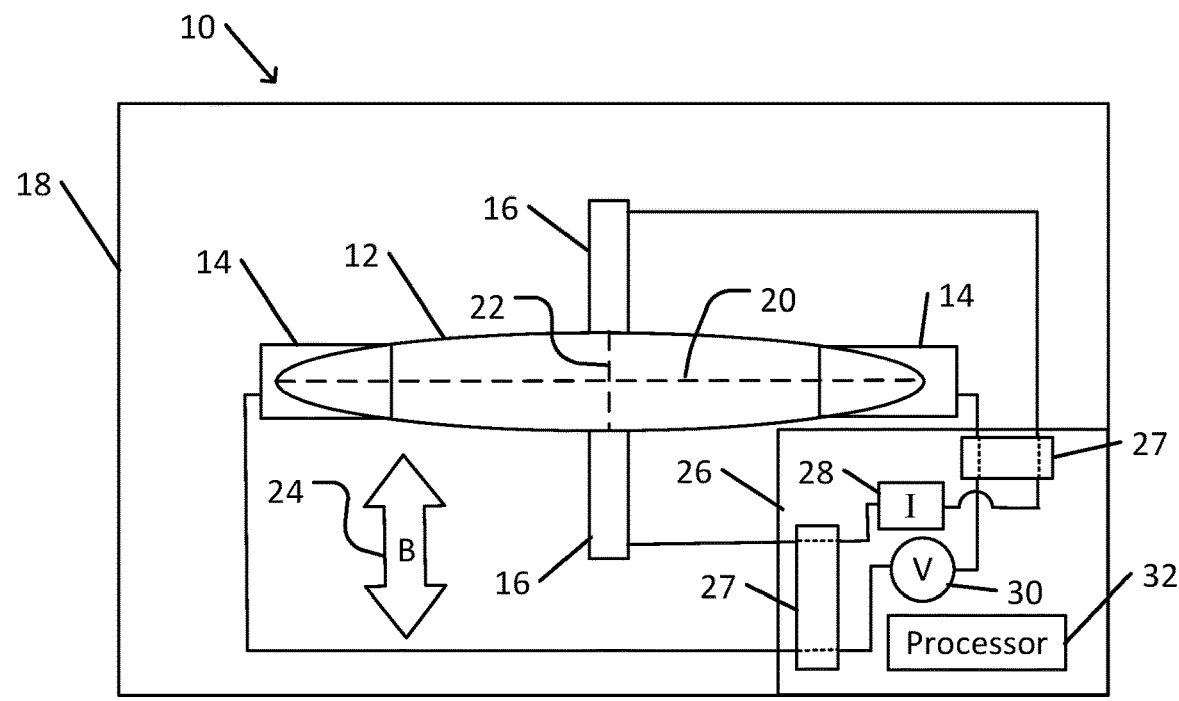
FIG. 1 schematically illustrates a planar Hall effect (PHE) sensor in accordance with an embodiment of the present invention.

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium (e.g., a memory) that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently. Unless otherwise indicated, the conjunction "or" as used herein is to be understood as inclusive (any or all of the stated options).

Some embodiments of the invention may include an article such as a computer or processor readable medium, or a computer or processor non-transitory storage medium, such as for example a memory, a disk drive, or a USB flash memory, encoding, including or storing instructions, e.g., computer-executable instructions, which when executed by a processor or controller, carry out methods disclosed herein.

In accordance with an embodiment of the present invention, a planar Hall effect (PHE) sensor includes an elongated region of ferromagnetic material. The ferromagnetic region is magnetized, in the absence of an external applied magnetic field, along a direction defining an easy magnetic axis. Two electrodes are connected to the ferromagnetic region along a single axis. At least one other pair of electrodes is connected to the ferromagnetic region along another axis.

In the presence of an external magnetic field having a component that is parallel to the plane of the ferromagnetic region and perpendicular to the direction of the easy magnetic axis, the direction of the magnetization of the ferromagnetic region may be altered. As a result, when a current is applied to the ferromagnetic region by the electrodes along one of the axes, a PHE voltage is induced along one of the other axes in the plane of the ferromagnetic material. This induced voltage may be measured via the electrodes that are connected to the ferromagnetic region along that other axis.

In accordance with an example of a PHE sensor, the PHE sensor includes two or more crossing parallel elongated regions of a ferromagnetic material. The regions cross and overlap in an overlap region surrounding a crossing point of the long axes of the regions. Typically, the crossing point is at or near the midpoints of the long axes. Two electrodes are connected to the overlap region along a single axis. At least one other pair of electrodes is connected to the overlap region along another axis.

For example, each of the regions may be in the form of an elongated oval shape, such as an elongated ellipse. In this case, an energetically favorable direction of magnetization of the region, or easy magnetic axis, is along the major axis of the ellipse. The regions cross such that the major axes of the elliptical regions cross at their midpoints. The regions overlap one another in an overlap region. The net magnetization in the overlap region is determined by a vector sum of the magnetizations of each of the crossing regions.

Typically, orientations of the crossing regions are arranged so as to form a discretely rotationally symmetric pattern about the overlap region. For example, when the PHE sensor has two crossing regions, the two regions may be arranged perpendicularly to one another. When the PHE sensor has three crossing regions, the three crossing regions may be oriented at equal angular intervals such that the major axis of each region forms an angle of 60° with the major axis of each of the other regions.

Thus, if two elliptical regions that are magnetized along their major axes cross at right angles, the direction of net magnetization, and thus the easy magnetic axes, in the overlap region may be oriented diagonally at a 45° angle to the major axes (and directions of magnetization) of each of the regions. The direction of the magnetization in the overlap region along one of the easy magnetic axes may depend on the directions of magnetization of each of the overlapping regions.

When three elliptical regions that are magnetized along their major axes cross at 60° angles, the direction of the easy magnetic axes in the overlap region may be oriented substantially along the major axes (and direction of magnetization) of the regions. The net magnetization may be oriented along one of the easy magnetic axes, while the net magnetization along the perpendicular to that axis may be substantially zero.

An example of a PHE sensor with crossing regions may include pairs of electrodes that are connected to the overlap region, such that the electrodes of each pair connect along one of the easy magnetic axes.

In the example of two crossing elliptical regions with two pairs of electrodes, each pair is connected to the overlap region along one of the 45° diagonals. A current may then be applied to the overlap region by one of the pairs of the electrodes, while a PHE voltage may be measured using the other pair. With this configuration, a single sensor may be used to measure magnetization in one of two perpendicular directions (e.g., the direction that is perpendicular to the axis along which the current is applied). By alternating magnetization between the two easy magnetic axes at the overlap region together with alternating the measurements between the two pairs, magnetization at a single location along two perpendicular directions may be measured in succession.

For example, an electrically conducting wire or strip may be oriented parallel to the long axis of one of the two crossing elliptical regions and perpendicular to the long axis of the other. An electrical current that is made to flow through the wire may generate a magnetic field that causes the direction of magnetization of that other elliptical region to reverse. Reversing the direction of magnetization of one of the crossing elliptical regions may cause the orientation of magnetization in the overlap region to change from one of the easy magnetic axes to the other. (If two wires are provided, each parallel to the long axis of a different crossing elliptical region, the direction of the magnetization in the overlap region, in addition to its orientation, may be controlled as well.) Other mechanisms known in the art may be utilized to the reverse the magnetization of one of the crossing elliptical regions.

Applying the current along an easy magnetic axis of the overlap region may enable increased sensitivity of the measurement over another configuration (e.g., where each pair of electrodes is connected to ends along the major axis of each region, e.g., since the current path is smaller and the electrical resistance may be reduced).

Similarly, in the configuration of three crossing regions, current may be applied to one of the regions by pairs of electrodes arranged along the major axis of that region. Voltages may be measured concurrently or alternately using two other pairs of electrodes. For example, each other pair of electrodes includes two electrodes on opposite sides of the easy magnetic axis (e.g., coinciding with a major axis of one of the regions) along which the overlap region is magnetized. For example, the two electrodes may be connected to two different crossing regions or may be arranged along the major axes of a single region. In addition, the magnetic state may be altered between the three easy magnetic axes at the overlap area (e.g., using two or more wires conducting electrical current, each oriented perpendicular to the major axis of each of two of the crossing elliptical regions, or otherwise). The resulting measurements may enable increased sensitivity of the measurement of the external magnetic field.

In an example of a PHE sensor, the PHE sensor may include a side-by-side arrangement of two or more elongated substantially identical (e.g., with regard to shape and size, materials, magnetization direction, or other properties) flat regions of ferromagnetic material, e.g., each in the form of an elongated ellipse. For example, the long axes of the ferromagnetic regions may be arranged to be substantially parallel to one another.

When so arranged, a single conducting lead may be connected to one end along the long axis of each of the regions. Similarly, the opposite ends along the long axes are connected to another conducting lead. Thus, all of the ferromagnetic regions are connected in parallel between the two longitudinal leads.

The regions along another, perpendicular axis (e.g., along the narrow axes of the ferromagnetic regions) are connected in series between two lateral terminals on opposite sides of the arrangement of regions.

For example, a current may be applied to all of the ferromagnetic regions between the two longitudinal leads. A PHE voltage may be generated in each of the regions along the lateral axis. Thus, a total voltage that is measured between the lateral leads may be equal to a sum of the PHE voltages that are generated by each of the regions.

When all of the regions are substantially identical to one another and an external magnetic field in the plane of the regions is substantially uniform at all of the regions, the total voltage may represent the strength and direction of the uniform field. However, since the total voltage is greater than each of the individual voltages (e.g., equal to the individual lateral voltage generated by each region multiplied by the number of regions), the signal-to-noise ratio of the measurement may be greater than that for a single region.

In some cases, the strength of the magnetic field may vary from one region to another. In this case, the total voltage may be indicative of a representative field strength at the sensor. For example, the representative field strength may include an average field strength, a weighted average of the field strength, or another representative field strength.

As another example, a current may be applied to the lateral terminals, with a voltage being generated between the longitudinal leads. In this case, when the magnetic field is uniform, the voltage that is measured between the longitudinal leads may be an average of the individual voltages that are generated by each of the regions.

In an example of a PHE sensor, a plurality of pairs of lateral conducting leads may be arranged along the long axis of a single elongated ferromagnetic region. A single pair of longitudinal leads may be connected to the ends of the region along the long axis of the region. For example, a current may be applied to the longitudinal leads. A voltage is measured across each pair of lateral leads, either concurrently or sequentially. The voltage that is measured across each of the lateral leads may be indicative of the magnetic field that is present at the location of that pair of lateral leads. In this manner, a single PHE sensor may be used to map the external magnetic field along the longitudinal axis of the elongated ferromagnetic region.

In some cases, a PHE sensor may be configured such that a current is applied via lateral leads to a short, lateral axis of an elongated ferromagnetic region. Such a configuration may be advantageous since the resistance across a lateral axis may be significantly lower than the resistance from end to end along a longitudinal axis of the region. In such a case, a PHE voltage may be induced by an external magnetic field along the longitudinal axis of the region. Thus, the magnetic field may be measured by measuring the induced voltage between the longitudinal leads.

In some cases, magnetic flux concentrators may be positioned adjacent to the elongated ferromagnetic region. For example, the flux concentrators may be constructed of a ferromagnetic material. In some cases, the flux concentrators may be electrically insulating, e.g., so as to prevent interference of the flux concentrators with applied electrical currents or voltage measurements made using electrical leads that are attached to the ferromagnetic region adjacent to the flux concentrators. Typically, similarly shaped and constructed flux concentrators may be placed opposite one another (e.g., mirroring one another) on opposite sides of the region. For example, an end of each flux concentrator that is distal to the ferromagnetic region may be wider than a proximal end that is adjacent to or abuts a side of the ferromagnetic region. A tapering shape of the flux concentrator (e.g., trapezoidal or otherwise) may concentrate the magnetic field such that the magnetic flux is greater in the ferromagnetic region than in the surround space outside of the flux concentrator. Such concentration of the magnetic flux may enable more sensitive measurement of the magnetic field. In addition, a flux concentrator may enable measurement a component of a magnetic field that is parallel to the direction of magnetization of the ferromagnetic region, e.g., by redirecting the flux to cross the region perpendicular to the direction of magnetization.

FIG. 1 schematically illustrates a planar Hall effect (PHE) sensor in accordance with an embodiment of the present invention.

PHE sensor 10 includes elongated magnetic region 12 connected by longitudinal electrical leads 14 and lateral electrical leads 16 to electrical system 26. Electrical system 26 may include one of more of switching circuitry 27, electrical current source 28, voltage measurement device 30, and a processor 32. One or more components of electrical system 26 may be included in PHE sensor 10 (e.g., provided in a single enclosure with or provided together with PHE sensor 10), or may be external to PHE sensor 10 (e.g., provided by a user of PHE sensor 10).

Elongated magnetic region 12 includes a substantially flat layer or region of ferromagnetic material. Typically, the ferromagnetic material is selected to be a soft ferromagnetic material that is characterized by high magnetic permeability and small hysteresis, and demonstrates anisotropic magnetoresistance. Suitable magnetic materials may include permalloy ($Ni_{80}Fe_{20}$), HyMu, mu-metal, or other suitable alloys (e.g., including one or more of nickel, cobalt, iron, chromium, nitrogen, molybdenum, or other components).

In some cases, the ferromagnetic material may be capped with a material with significantly lower electrical conductivity than that of the ferromagnetic material. For example, such a capping layer may include one or more of tantalum, titanium, chromium, silicon oxide (SiO), aluminum oxide ($Al_2O_3$), or another suitable high-resistance conductor or electrical insulator.

For example, elongated magnetic region 12 may include one or more layers of a ferromagnetic material that are deposited or otherwise caused to adhere to a substrate. The depositing process may include evaporation or sputtering, or another depositing technique. A substrate may include silicon or another suitable material.

Elongated magnetic region 12 may be characterized by a longitudinal axis 20 along the long dimension of elongated magnetic region 12, and by lateral axis 22 along a short lateral direction that is perpendicular to longitudinal axis 20. Typically, elongated magnetic region 12 is magnetized such that in the absence of an external magnetic field, the magnetization of elongated magnetic region 12 is in the direction of longitudinal axis 20. For example, the ferromagnetic material may be deposited while the substrate of elongated magnetic region 12 is placed in a magnetic field that is parallel to longitudinal axis 20.

The shape of elongated magnetic region 12 may be substantially elliptical, as in the example shown. For example, in some cases, the magnetic anisotropy of an elliptical elongated magnetic region 12 may be more uniform than that of region having another type of shape. When elongated magnetic region 12 is elliptical, longitudinal axis 20 may correspond to a major axis of the ellipse, and lateral axis 22 may correspond to a minor axis.

Longitudinal electrical leads 14 are connected to the ends of elongated magnetic region 12 along longitudinal axis 20. Similarly, lateral electrical leads 16 are connected to opposite sides of elongated magnetic region 12 along lateral axis 22. For example, longitudinal electrical leads 14 and lateral electrical leads 16 may be deposited or otherwise formed of one or more electrically conducting materials such as gold, silver, copper, aluminum, or other conducting metals or materials.

In some cases, one or more of elongated magnetic region 12, longitudinal electrical leads 14, lateral electrical leads 16, or other components may be mounted or placed on a mounting surface 18. For example, mounting surface 18 may include a circuit board or other suitable surface. In other cases, components of PHE sensor 10 may be otherwise assembled, connected, or otherwise prepared for use.

PHE sensor 10 may include an electrical current source 28. As used herein, electrical current source 28 refers to any current or voltage source whose purpose is to cause an electrical current to flow within PHE sensor 10 between two electrodes that are connected to the source, regardless as to how the source is regulated or controlled. Electrical current source 28 may be connected to longitudinal electrical leads 14 to cause a current to flow parallel to longitudinal axis 20, or to lateral electrical leads 16 to cause the current to flow parallel to lateral axis 22. Voltage measurement device 30 may be connected to the other set of leads, lateral electrical leads 16 or longitudinal electrical leads 14, respectively.

As described above, the magnetization of elongated magnetic region 12 in the absence of an external magnetic field may be parallel to longitudinal axis 20. When an external magnetic field is present and the external field has a component in the plane of elongated magnetic region 12, the resulting magnetization of elongated magnetic region 12 may be rotated by an angle $\theta$ away from longitudinal axis 20 that depends on the component of the in-plane magnetic field that is perpendicular to longitudinal axis 20. The magnetization may interact with the current to generate a PHE voltage along the axis that is perpendicular to the current flow due to the anisotropic magnetoresistance (AMR) effect. The PHE voltage may be measured by voltage measurement device 30 that is connected to the electrical leads that are arranged perpendicularly to the current flow. Since the PHE voltage that is measured perpendicular to the current flow is proportional to $\sin(2\theta)$, the voltage increase may be expected to be approximately linear with the perpendicular (to the current flow) component of the magnetization when $\theta$ is close to zero or to 90°.

For example, electrical current source 28 may be connected to longitudinal electrical leads 14. Thus, when the magnetization of elongated magnetic region 12 (e.g., in the absence of an external magnetic field) is parallel to longitudinal axis 20, the direction of current flow through elongated magnetic region 12 is substantially parallel to the magnetization of elongated magnetic region 12. Voltage measurement device 30 may be connected to lateral electrical leads 16 to measure a component a PHE voltage that is indicative of a component of an external magnetic field that is substantially parallel to lateral axis 22.

In the example shown, electrical current source 28 is connected to lateral electrical leads 16. When the magnetization of elongated magnetic region 12 (e.g., in the absence of an external magnetic field) is parallel to longitudinal axis 20, the direction of the current flow through elongated magnetic region 12 is substantially perpendicular to the magnetization in the absence of an external magnetic field. In the presence of an external magnetic field 24 having a component that is substantially parallel to lateral axis 22 (as in the example shown), a voltage that is measured by voltage measurement device 30 that is connected to longitudinal electrical leads 14 may be indicative of that component.

A configuration where electrical current source 28 is connected to lateral electrical leads 16 may be advantageous over a configuration where electrical current source 28 is connected to longitudinal electrical leads 14. For example, since the resistance between lateral electrical leads 16 is lower than the resistance between longitudinal electrical leads 14, a stronger applied current, and thus a stronger generated PHE voltage, may enable more precise, accurate, or sensitive measurement of external magnetic field 24.

Switching circuitry 27 may be operated to switch between a configuration where electrical current source 28 is connected to longitudinal electrical leads 14 and voltage measurement device 30 is connected to lateral electrical leads 16, and a configuration where the connections are interchanged (electrical current source 28 to lateral electrical leads 16 and voltage measurement device 30 to longitudinal electrical leads 14). For example, switching circuitry 27 may include one or more switches or switching elements that may be operated to change a connection of electrical current source 28 or voltage measurement device 30 to one or more different pairs of electrical leads (e.g., longitudinal electrical leads 14 and lateral electrical leads 16 as in the example shown).

Processor 32 may be configured to calculate a strength of external magnetic field 24 based on a measurement of a PHE voltage by voltage measurement device 30. For example, a calibration procedure may be applied to PHE sensor 10. The calibration procedure may be configured to enable processor 32 to associate a measured PHE voltage with an independently measured or determined strength (e.g., in units of magnetic flux density or other units) of external magnetic field 24.

In an example of a PHE sensor, magnetic flux concentrators may be added. Addition of magnetic flux concentrators may enable increasing the sensitivity of a measurement of a magnetic field.

Figure 2A:
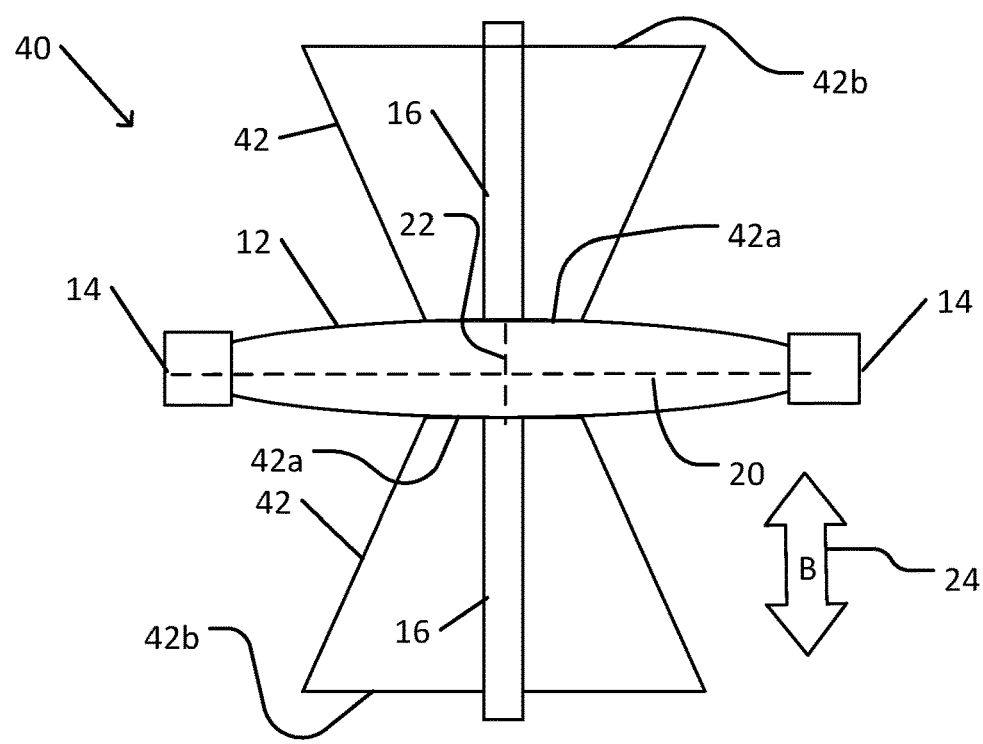
FIG. 2A schematically illustrates components of the PHE sensor shown in FIG. 1, with magnetic flux concentrators configured to concentrate magnetic flux that is perpendicular to the easy magnetic axis.
Figure 2B:
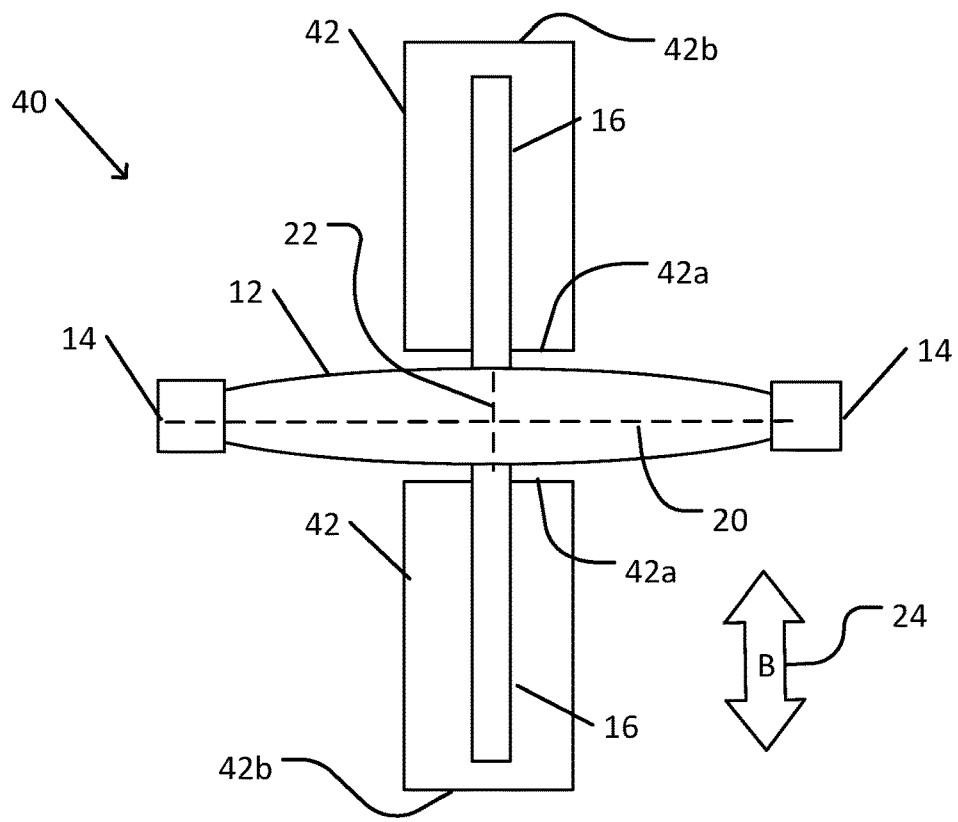
FIG. 2B schematically illustrates a variant of the magnetic flux concentrators shown in FIG. 2A.

FIG. 2A schematically illustrates components of the PHE sensor shown in FIG. 1, with magnetic flux concentrators. FIG. 2B schematically illustrates a variant of the magnetic flux concentrators shown in FIG. 2A.

PHE sensor 40 includes a pair of flat magnetic flux concentrators 42 arranged on opposite sides of elongated magnetic region 12. In the example shown, PHE sensor 40 is configured to measure a component of an external magnetic field 24 that is parallel to lateral axis 22. For example, electrical current source 28 may be connected to longitudinal electrical leads 14, and voltage measurement device 30 may be connected to lateral electrical leads 16. The axis of each magnetic flux concentrator 42 is oriented parallel to lateral axis 22 so as to concentrate the magnetic flux that is parallel to lateral axis 22 into elongated magnetic region 12.

Each magnetic flux concentrator 42 is constructed of at least one layer or region of ferromagnetic material. The ferromagnetic material of magnetic flux concentrator 42 may be electrically isolated from other electrically conducting components such as elongated magnetic region 12 and lateral electrical leads 16, in the example shown.

In the example shown in FIG. 2A, each magnetic flux concentrator 42 has a trapezoidal shape. A proximal face 42a of magnetic flux concentrator 42 is adjacent to elongated magnetic region 12 (typically abutting or sufficiently close such that most magnetic flux lines cross elongated magnetic region 12 substantially parallel to lateral axis 22). In the example shown, each proximal face 42a is approximately parallel to longitudinal axis 20 and perpendicular to lateral axis 22. In other examples, proximal faces 42a may be slanted at an oblique angle to longitudinal axis 20. Distal face 42b of each magnetic flux concentrator 42 is wider than proximal face 42a. The shape of magnetic flux concentrator 42 gradually tapers between distal face 42b and proximal face 42a. In the example shown, the tapering sides of magnetic flux concentrator 42 are straight. In other examples, the sides may be convexly or concavely curved. The tapering shape may facilitate the magnetic flux (e.g., which may be visualized as a density of magnetic field lines) of external magnetic field 24 to become concentrated in the part of elongated magnetic region 12 between magnetic flux concentrators 42. Thus, in the example shown, the component of the magnetization that is parallel to lateral electrical leads 16 in elongated magnetic region 12 may be stronger than the component that would be present in the absence of magnetic flux concentrators 42. Therefore, the measurement of external magnetic field 24 may be more sensitive than a measurement made without magnetic flux concentrators 42.

In the example shown in FIG. 2B, proximal face 42a and distal face 42b have approximately the same width, where the properties of the material of magnetic flux concentrators 42 concentrates the magnetic flux in the region between proximal faces 42a. Alternatively, a magnetic flux concentrator 42 may have another shape. For example, a magnetic flux concentrator 42 may be triangular, T-shaped, L-shaped, curved, or otherwise shaped, and may have a three-dimensional shape (e.g., rod, cone, pyramid, or other three-dimensional shape).

In the examples shown in FIGS. 2A and 2B, magnetic flux concentrators 42 are configured to concentrate magnetic flux of a component of an external magnetic field 24 that is parallel to lateral axis 22. In some cases, a magnetic flux concentrator may be configured to redirect magnetic flux from an external magnetic field that is parallel to the magnetization axis (longitudinal axis 20) of elongated magnetic region 12 (in the plane of elongated magnetic region 12), or that is perpendicular to the plane of elongated magnetic region 12, so as to cross elongated magnetic region 12 substantially perpendicular to the magnetization axis (and in the plane of elongated magnetic region 12).

Figure 2C:
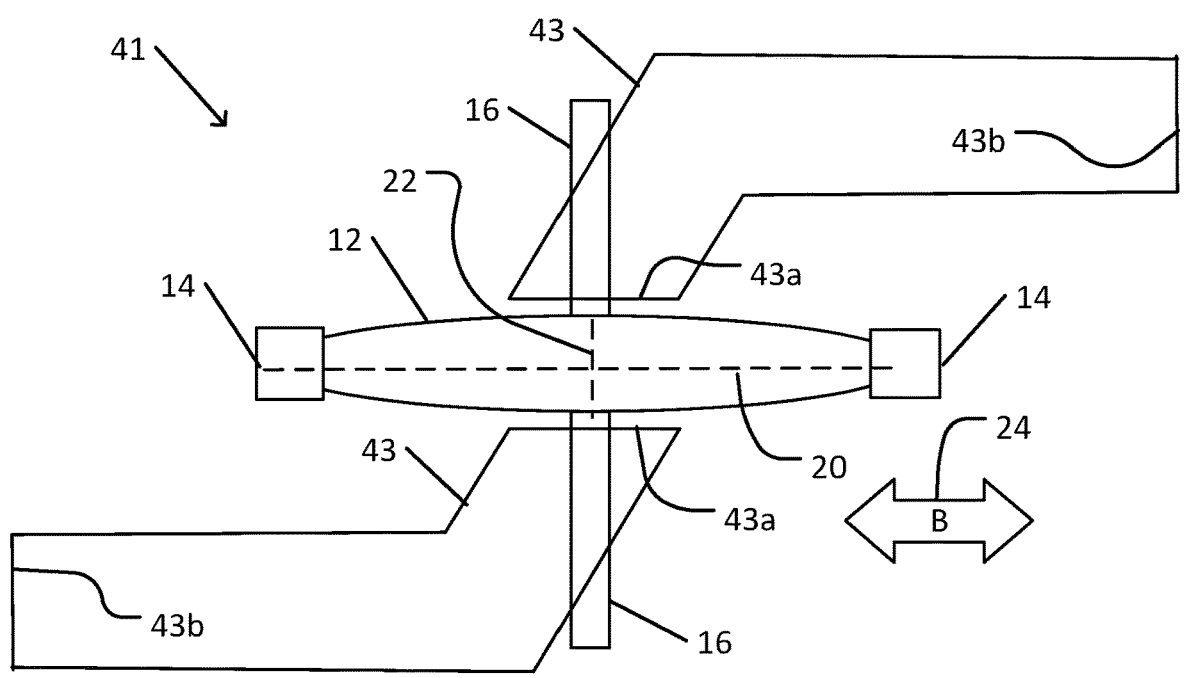
FIG. 2C schematically illustrates components of the PHE sensor shown in FIG. 1, with magnetic flux concentrators configured to concentrate and redirect magnetic flux in the plane of the elongated magnetic region of the PHE sensor.

FIG. 2C schematically illustrates components of the PHE sensor shown in FIG. 1, with magnetic flux concentrators configured to concentrate and redirect magnetic flux in the plane of the PHE sensor.

PHE sensor 41 includes a pair of magnetic flux concentrators 43 arranged on both sides of elongated magnetic region 12. In the example shown, PHE sensor 41 is configured to measure a component of an external magnetic field 24 that is parallel to longitudinal axis 20. Each magnetic flux concentrator 43 is configured to direct magnetic flux that is substantially parallel to longitudinal axis 20 and that enters magnetic flux concentrator 43 at distal faces 43b to cross elongated magnetic region 12 substantially parallel to lateral axis 22 at proximal faces 43a. Thus, PHE sensor 41 may be utilized to measure a component of a magnetic field that is parallel to, or at another angle to, the easy magnetic axis of elongated magnetic region 12.

In the example shown, each magnetic flux concentrator 43 has an angled elbow shape. Alternatively or in addition, a direction changing magnetic flux concentrator may be tapering or have a constant width, and may be curved, or otherwise shaped.

An example of a PHE sensor may be configured to map or local sample a magnetic field at a plurality of locations along an axis.

Figure 2D:
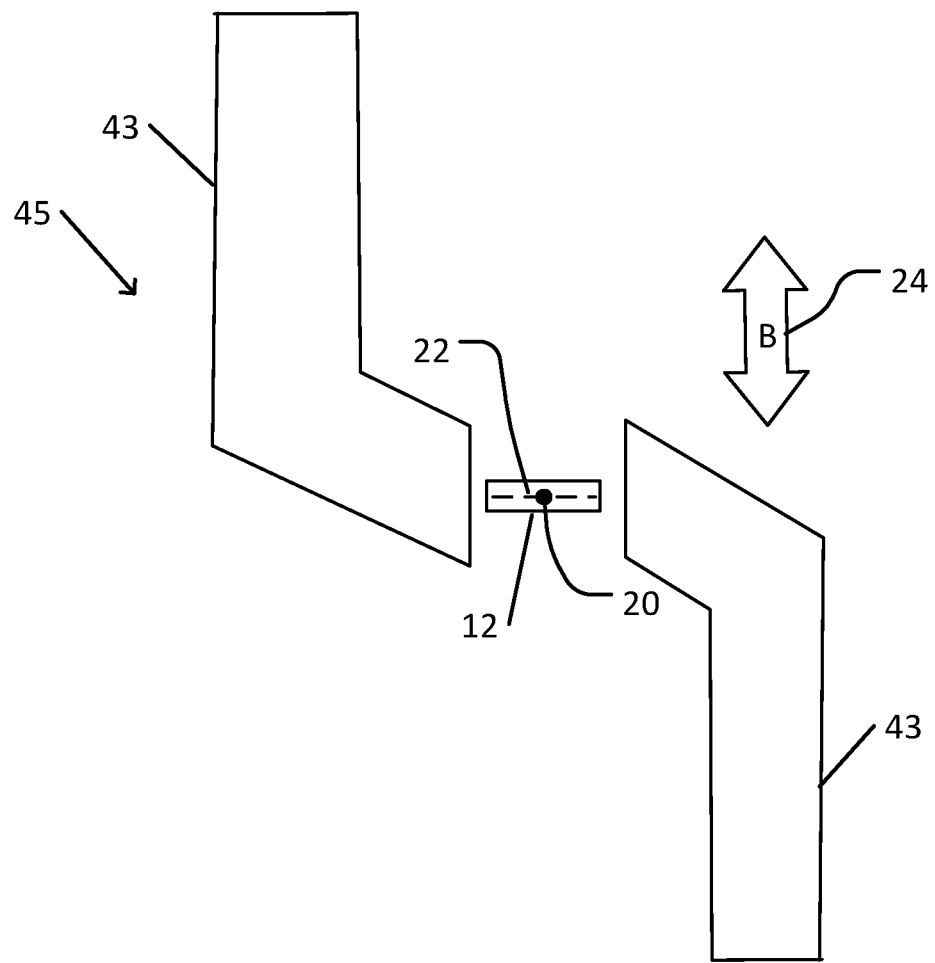
FIG. 2D schematically illustrates components of the PHE sensor shown in FIG. 1, with magnetic flux concentrators configured to concentrate and redirect magnetic flux perpendicular to the plane of the elongated magnetic region of the PHE sensor.

FIG. 2D schematically illustrates components of the PHE sensor shown in FIG. 1, with magnetic flux concentrators configured to concentrate and redirect magnetic flux perpendicular to the plane of the elongated magnetic region of the PHE sensor.

In FIG. 2D, PHE sensor 45 is viewed in a plane that is perpendicular to the plane of FIG. 1 and along longitudinal axis 20. The electrical leads are omitted for the sake of clarity.

PHE sensor 45 includes a pair of magnetic flux concentrators 43 arranged on both sides of elongated magnetic region 12. In the example shown, PHE sensor 45 is configured to measure a component of an external magnetic field 24 that is perpendicular to the plane defined by longitudinal axis 20 and lateral axis 22. Each magnetic flux concentrator 43 is configured to direct magnetic flux that is perpendicular to longitudinal axis 20 and to lateral axis 22 to cross elongated magnetic region 12 substantially parallel to lateral axis 22 and perpendicular to longitudinal axis 20. Thus, PHE sensor 45 may be utilized to measure a component of a magnetic field that is perpendicular to the plane of (longitudinal axis 20 and lateral axis 22 of) elongated magnetic region 12.

Figure 3:
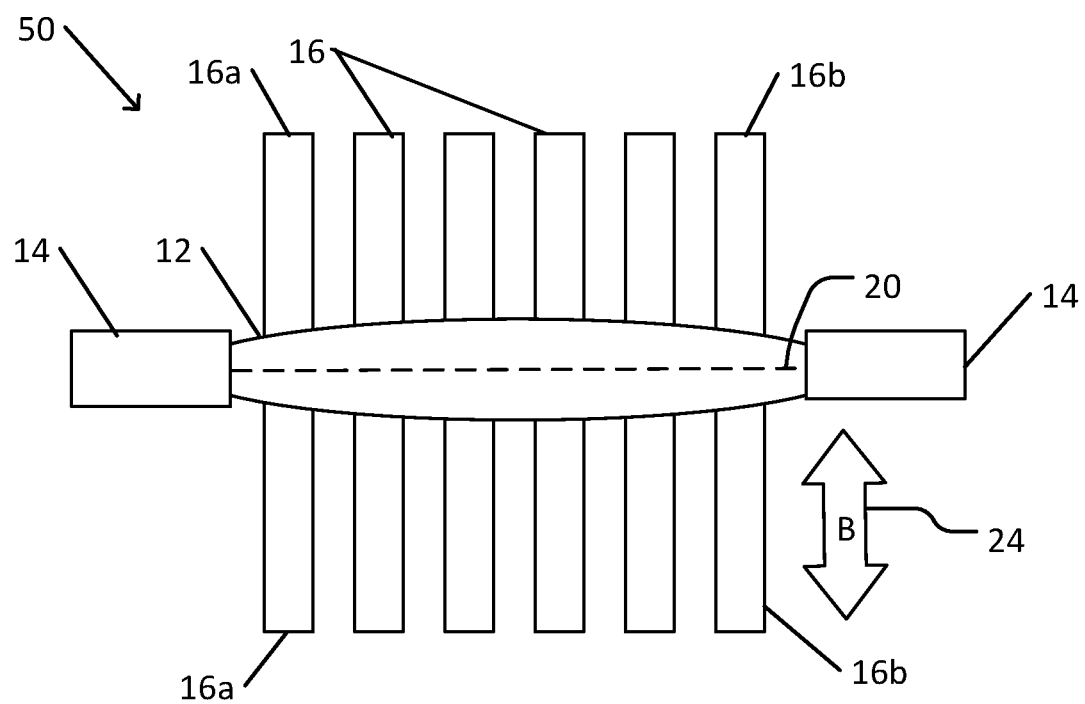
FIG. 3 schematically illustrates a PHE sensor that is configured to map variations in a magnetic field along an axis.

FIG. 3 schematically illustrates a PHE sensor that is configured to locally sample a magnetic field along an axis.

PHE mapping sensor 50 is configured to measure along longitudinal axis 20 variations in a component of external magnetic field 24 that is perpendicular to longitudinal axis 20. A plurality of pairs of lateral electrical leads 16 are longitudinally displaced from one another and longitudinally distributed along the long dimension (longitudinal axis 20) of elongated magnetic region 12 and parallel to the plane of elongated magnetic region 12. For example, pairs of lateral electrical leads 16 may be substantially uniformly distributed between end pair 16a and end pair 16b, or may be otherwise distributed.

When PHE mapping sensor 50 is in use, electrical current source 28 may be connected to longitudinal electrical leads 14. One or more voltage measurement devices 30 may be connected to each pair of lateral electrical leads 16. For example, a separate voltage measurement device 30 may be connected to each pair of lateral electrical leads 16. In this case, the voltages across all pairs of lateral electrical leads 16 may be measured concurrently or sequentially. Alternatively or in addition, switching circuitry 27 may be provided to selectively connect a single voltage measurement device 30 to one or more pairs of lateral electrical leads 16. In this case, voltages across different pairs of lateral electrical leads 16, or groups of two or more pairs of lateral electrical leads 16, may be measured sequentially.

The voltage across each pair of lateral electrical leads 16 may be indicative of a lateral component of external magnetic field 24 in a region of elongated magnetic region 12 between that pair of lateral electrical leads 16. Thus, when voltages between two or more pairs of lateral electrical leads 16 are measured concurrently or (assuming that external magnetic field 24 does not change appreciably between voltage measurements on different pairs of lateral electrical leads 16) sequentially, the voltage measurements across the different pairs of lateral electrical leads 16 may be indicative of variations in the lateral component of external magnetic field 24 along the length of longitudinal axis 20, or a gradient of the lateral component along longitudinal axis 20. Thus, PHE mapping sensor 50 may be utilized to measure a gradient or other spatial variation of the lateral component of external magnetic field 24. Subsequent measurements after rotation of PHE mapping sensor 50 (e.g., by 90° about longitudinal axis 20) may map another component of external magnetic field 24 along longitudinal axis 20. (Other rotations or translations of PHE mapping sensor 50 may map external magnetic field 24 at nearby coordinates in space.)

An example of a PHE sensor in which a plurality of parallelly aligned and mutually laterally displaced elongated magnetic regions 12 are connected to a single set of electrical leads may enable measuring larger PHE voltages, e.g., to improve the sensitivity of a measurement of external magnetic field 24.

Figure 4:
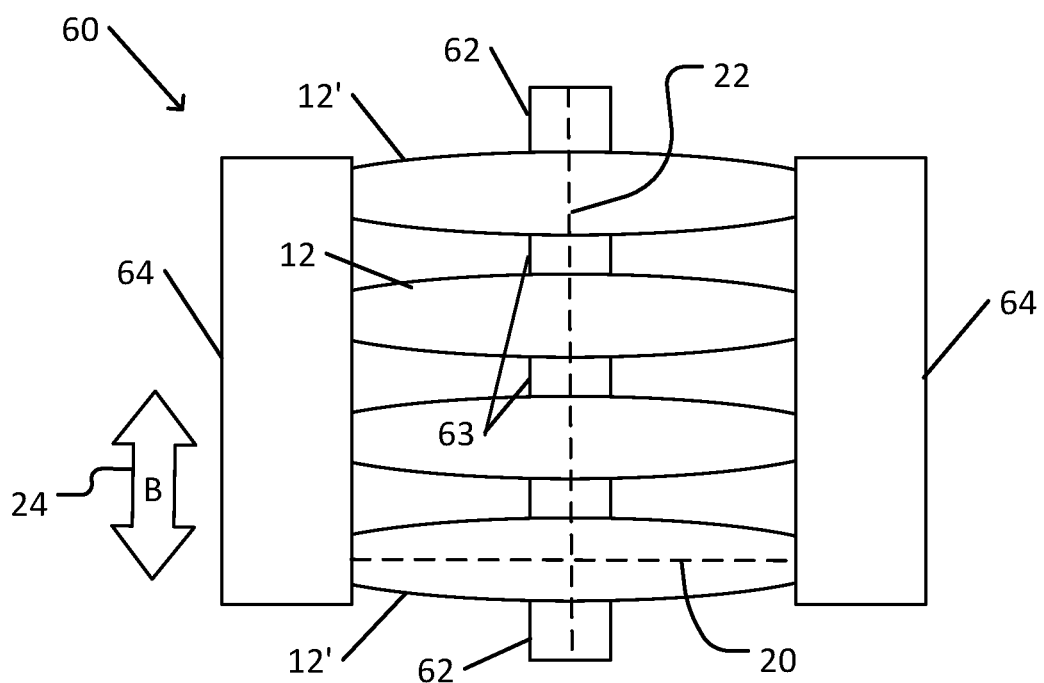
FIG. 4 schematically illustrates a PHE sensor that includes an array of parallelly aligned elongated magnetic regions that are connected to a single pair of electrical leads.

FIG. 4 schematically illustrates a PHE sensor that includes an array of parallelly aligned elongated magnetic regions that are connected to single pairs of electrical leads.

In multiple region PHE sensor 60, an array of a plurality of elongated magnetic regions 12 are oriented parallelly to one another, and are spatially aligned along their common lateral axis 22. Each elongated magnetic region 12 is laterally displaced from the other elongated magnetic regions 12 of PHE sensor 60 along the common lateral axis 22 between outside magnetic regions 12' at the ends of the array of parallel elongated magnetic regions 12. (When PHE sensor 60 includes only two elongated magnetic regions 12, each elongated magnetic region 12 is an outside magnetic region 12'). Although multiple region PHE sensor 60 has four elongated magnetic regions 12 in the example shown, a multiple region PHE sensor 60 may include two, three, or more than four elongated magnetic regions 12. Although in the example shown, the mutual displacements between adjacent elongated magnetic regions 12 are approximately equal, e.g., elongated magnetic regions 12 being distributed approximately uniformly along lateral axis 22, other non-uniform distributions (e.g., with unequal displacements) are possible.

Each end of each elongated magnetic region 12 along longitudinal axis 20 is connected to a single common longitudinal electrical lead 64. Thus, all elongated magnetic regions 12 of multiple region PHE sensor 60 may be connected in parallel to common longitudinal electrical leads 64.

All elongated magnetic regions 12 of multiple region PHE sensor 60 may be connected in series along lateral axis 22 to at least one pair of common lateral electrical leads 62. Each common lateral electrical lead 62 is connected to one of outside magnetic regions 12'. For example, each elongated magnetic region 12 of multiple region PHE sensor 60 may be connected to each adjacent elongated magnetic region 12 via an internal lateral electrical conductor 63.

For example, in one configuration, common longitudinal electrical leads 64 may be connected to electrical current source 28. Thus, a current may be caused to flow in parallel between common longitudinal electrical leads 64. For example, if the resistances of all of elongated magnetic regions 12 along longitudinal axis 20 may be identical or similar to one another. In this case, the total current between longitudinal electrical leads 14 may be distributed approximately uniformly among elongated magnetic regions 12.

In this example, an external magnetic field 24 with a component parallel to lateral axis 22 may induce a PHE voltage in each elongated magnetic region 12 along lateral axis 22. Thus, a voltage measurement device 30 that is connected to common lateral electrical leads 62 may measure a sum of the PHE voltages that are generated in each elongated magnetic region 12.

When external magnetic field 24 is substantially uniform over all elongated magnetic regions 12 of multiple region PHE sensor 60, the total measured voltage across common lateral electrical leads 62 may be approximately equal to the PHE voltage that is induced in each elongated magnetic region 12 multiplied by the number of elongated magnetic regions 12 in multiple region PHE sensor 60. Thus, a measurement of external magnetic field 24 that is measured using multiple region PHE sensor 60 may be more precise, accurate, or sensitive than a similar measurement with a PHE sensor having a single elongated magnetic region 12. When external magnetic field 24 varies along lateral axis 22, the total measured voltage across common lateral electrical leads 62 may be indicative of a representative magnetic field (e.g., average field or other representative strength of a component of external magnetic field 24).

As another example, common lateral electrical leads 62 may be connected to electrical current source 28. Thus, a current may be caused to flow in series between internal lateral electrical conductors 63. In this example, an external magnetic field 24 with a component parallel to lateral axis 22 may induce a PHE voltage in each elongated magnetic region 12 along longitudinal axis 20. Thus, a voltage measurement device 30 that is connected to common longitudinal electrical leads 64 may measure a representative value of the PHE voltages that are generated in each elongated magnetic region 12.

In some cases, more than one pair of common lateral electrical leads 62 may be connected to outside magnetic regions 12', e.g., as in PHE mapping sensor 50. In this case, additional sets of internal lateral electrical conductors 63 may be aligned with each pair of common lateral electrical leads 62.

An example of a PHE sensor may include two elongated magnetic regions 12 that cross each other at right angles such that the longitudinal axis of each of the elongated magnetic regions 12 coincides with the lateral axis of the other.

Figure 5:
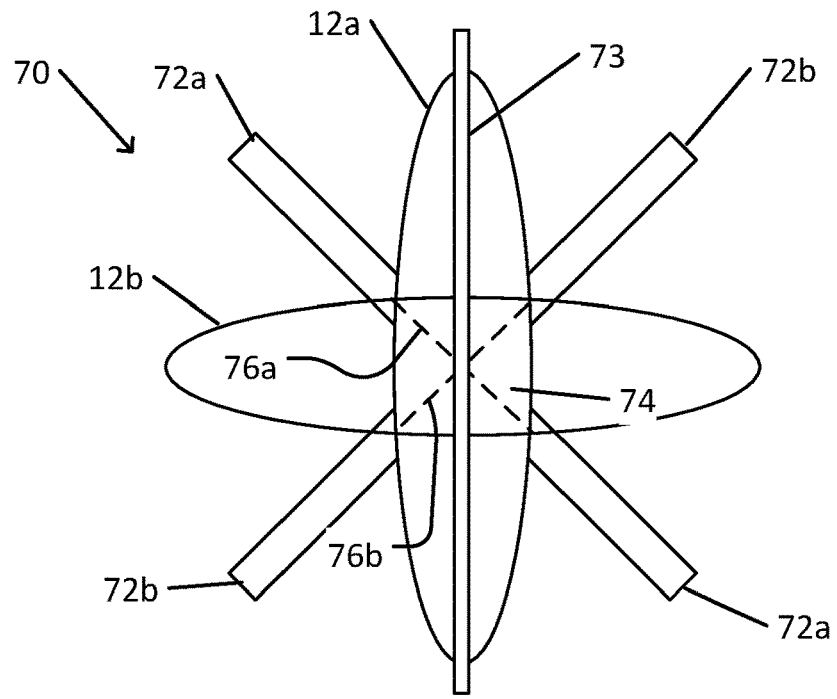
FIG. 5 schematically illustrates a PHE sensor in the form of two crossing elongated magnetic regions.

FIG. 5 schematically illustrates a PHE sensor that includes two crossing elongated magnetic regions.

In crossed-region PHE sensor 70, two substantially identical elongated magnetic regions 12 are oriented perpendicularly to one another. Each elongated magnetic region 12 is magnetized (in the absence of an external magnetic field) along its longitudinal axis 20 (e.g., as in FIG. 1). Both elongated magnetic regions 12 are magnetized with a substantially identical magnetization (e.g., with regard to magnitude of the magnetization). In the example shown, elongated magnetic regions 12 cross along their midlines, both along their longitudinal axes 20 and their lateral axes 22. The two elongated magnetic regions 12 overlap one another in overlap region 74.

Since the magnetization of each elongated magnetic region 12 is along its longitudinal axis 20 and the magnitudes of the magnetizations are substantially equal, the total magnetization in overlap region 74 is along a diagonal easy magnetic axis 76a or diagonal easy magnetic axis 76b (depending on the direction of the magnetization of each elongated magnetic region 12 along its longitudinal axis 20). Each of diagonal easy magnetic axis 76a and diagonal easy magnetic axis 76b lies along a diagonal at 45° to the longitudinal axes of the two elongated magnetic regions 12.

Pairs of electrical leads 72a are connected to both elongated magnetic regions 12 at overlap region 74 aligned with diagonal easy magnetic axis 76a. Similarly, electrical leads 72b are connected to both elongated magnetic regions 12 at overlap region 74 aligned with diagonal easy magnetic axis 76b. For example, an electrical lead 72a or 72b may be connected by conducting material to both elongated magnetic regions 12.

In crossed-region PHE sensor 70, either electrical leads 72a or electrical leads 72b may be connected to electrical current source 28, while the other pair of electrical leads 72b or 72a, respectively, may be connected to voltage measurement device 30. For example, electrical system 26 of crossed-region PHE sensor 70 may include switching circuitry 27 that may be controlled to alternately switch between a configuration in which electrical leads 72a are connected to electrical current source 28 while electrical leads 72b are connected to voltage measurement device 30, and a configuration where electrical leads 72a are connected to voltage measurement device 30 and electrical leads 72b are connected to electrical current source 28. Alternatively, electrical system 26 of crossed-region PHE sensor 70 may be configured such that electrical leads 72a are permanently connected to one of electrical current source 28 and voltage measurement device 30, while electrical leads 72b are permanently connected to the other.

For example, if the magnetization in the overlap region 74 is parallel to diagonal easy magnetic axis 76a, the PHE voltage is indicative of a component of the external magnetic filed along diagonal easy magnetic axis 76b. On the other hand, if the magnetization in the overlap region 74 is parallel to diagonal easy magnetic axis 76b, the PHE voltage is indicative of a component of the external magnetic filed along diagonal easy magnetic axis 76a.

Thus, electrical system 26 may be provided with a capability to switch the magnetization in overlap region 74 between diagonal easy magnetic axis 76a and diagonal easy magnetic axis 76b. For example, a magnetization control conductor 73 (e.g., wire, rod, bar, strip, or other substantially straight elongated conductor) may be oriented substantially parallel to the longitudinal axis of one of elongated magnetic regions 12 (elongated magnetic region 12a in the example shown) and displaced from the plane of that elongated magnetic region 12 (e.g., above or below the plane of FIG. 5). Causing an electrical current to flow through magnetization control conductor 73 in one direction generates a magnetic field at the other elongated magnetic region 12 (e.g., elongated magnetic region 12b in the example shown) parallel to the longitudinal axis of that other elongated magnetic region 12. Reversing the direction of electrical current through magnetization control conductor 73 reverses the direction of the generated magnetic field. A sufficiently strong generated magnetic field may cause the direction of magnetization of the other elongated magnetic region 12 (e.g., elongated magnetic region 12b) to reverse. Therefore, controlling the current through magnetization control conductor 73 may control the magnetization of elongated magnetic region 12b, and thus the orientation of the magnetization in overlap region 74 along either diagonal easy magnetic axis 76a or diagonal easy magnetic axis 76b.

In some cases, an addition magnetization control conductor 73 parallel to the longitudinal axis of the other elongated magnetic region 12 (e.g., elongated magnetic region 12b) may be provided, e.g., to control the direction of the magnetization of overlap region 74. Other mechanisms for controlling the orientation of magnetization in overlap region 74 may be provided.

Thus, two orthogonal components of external magnetic field 24 may be measured alternately. Such alternating between configurations may be advantageous over an alternative measurement by that would require physical rotation of a PHE sensor. For example, the more rapid measurement of orthogonal components of external magnetic field 24 by crossed-region PHE sensor 70 may be more accurate than the alternative measured which could be affected by temporal changes in external magnetic field 24. Similarly, use of single crossed-region PHE sensor 70 to measure two orthogonal components of external magnetic field 24 at a single spatial location (e.g., at overlap region 74) may be advantageous over an alternative measurement of orthogonal components external magnetic field 24 by two differently oriented PHE sensors at different, nearby locations. The measurement using crossed-region PHE sensor 70 may be more accurate than the alternative measurement, which could be affected by spatial variations in external magnetic field 24.

An example of a PHE sensor may include three or more crossing elongated magnetic regions 12.

Figure 6:
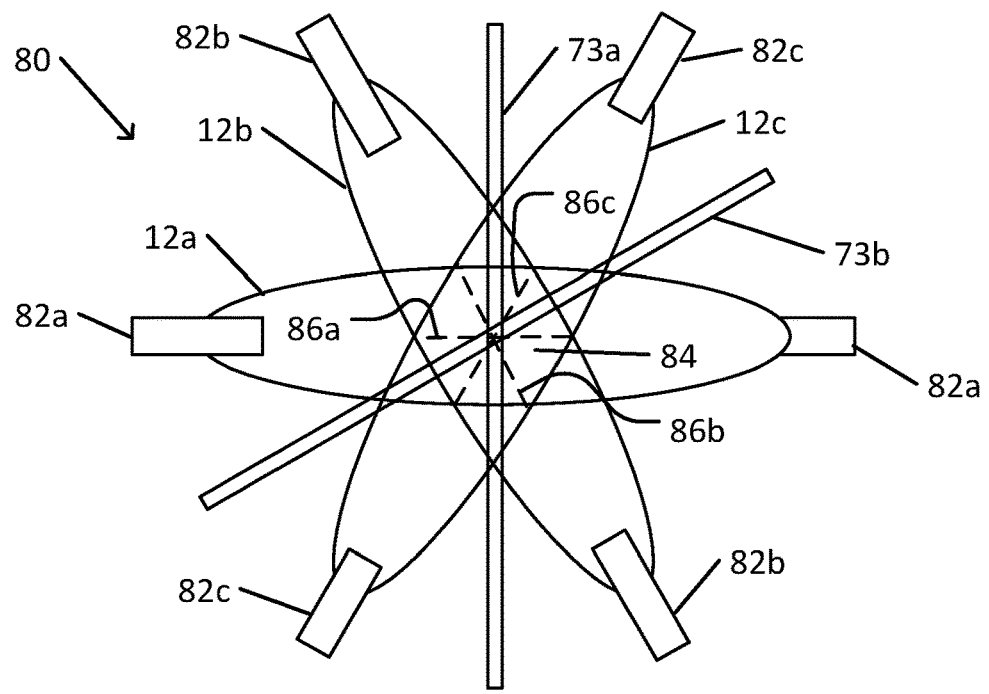
FIG. 6 schematically illustrates a PHE sensor in the form of three crossing elongated magnetic regions.

FIG. 6 schematically illustrates a PHE sensor that includes three crossing elongated magnetic regions.

In crossed-region PHE sensor 80, three substantially identical elongated magnetic regions 12a, 12b, and 12c are rotated with respect to one another by substantially equal rotation angles (about 60° rotations relative to the other two elongated magnetic regions 12). Each of elongated magnetic regions 12a, 12b, and 12c is magnetized (in the absence of an external magnetic field) along its longitudinal axis 20 (e.g., as in FIG. 1). All elongated magnetic regions 12a, 12b, and 12c are magnetized with a substantially identical magnetization (e.g., substantially identical magnitude of the magnetization). In the example shown, elongated magnetic regions 12a, 12b, and 12c cross along their midlines, both along their longitudinal axes 20 and their lateral axes 22. The elongated magnetic regions 12a, 12b, and 12c overlap one another in overlap region 84.

Since the magnetization of each of elongated magnetic regions 12a, 12b, and 12c is along its longitudinal axis 20 and the magnitudes of the magnetizations are substantially equal, the total magnetization in overlap region 84 is along one of easy magnetic axis 86a, easy magnetic axis 86b, or easy magnetic axis 86c (depending on the direction of the magnetization of each of elongated magnetic regions 12a, 12b, and 12c along its longitudinal axis 20). Thus, in the example shown, easy magnetic axes 86a, 86b, and 86c coincide with the longitudinal axis 20 of one of elongated magnetic regions 12a, 12b, and 12c. For example, the magnetization may be parallel to easy magnetic axis 86a if the components of the magnetizations of elongated magnetic regions 12b and 12c that are parallel to easy magnetic axis 86a are in the same direction as the magnetization of elongated magnetic region 12a, while the components of the magnetizations of elongated magnetic regions 12b and 12c that are perpendicular to easy magnetic axis 86a are oriented opposite to one another (e.g., the magnetization of elongated magnetic region 12a is to the right in FIG. 6, the magnetization of elongated magnetic region 12b is to lower right, and the magnetization of elongated magnetic region 12c is toward upper right, or when all of the magnetizations are reversed).

For example, at least two magnetization control conductors 73a and 73b may be oriented substantially parallel to the lateral axes of at least two elongated magnetic regions 12 (elongated magnetic region 12a and 12b in the example shown) and displaced from the plane of that elongated magnetic regions 12a and 12b (e.g., above or below the plane of FIG. 6). Controlling a direction of current flow through each of magnetization control conductors 73a and 73b may control the magnetization in each of elongated magnetic regions 12a and 12b, respectively. Controlling the direction of magnetization in elongated magnetic regions 12a and 12b cause magnetization within in overlap region 84 to be selectively oriented along one of easy magnetic axes 86a-86c.

In some cases, an addition magnetization control conductor parallel to the lateral axis of elongated magnetic region 12c may be provided, enabling directional control of the magnetization in overlap region 84. Other mechanisms for controlling the orientation of magnetization in overlap region 84 may be provided.

Electrical lead pair 82a is connected to elongated magnetic regions 12a aligned with easy magnetic axis 86a. Similarly, electrical lead pair 82b is connected to elongated magnetic region 12b aligned with easy magnetic axis 86b, and electrical lead pair 82c is connected to elongated magnetic region 12c aligned with easy magnetic axis 86c.

In crossed-region PHE sensor 80, one of electrical lead pairs 82a, 82b, or 82c may be connected to electrical current source 28. One or both of the other electrical lead pairs 82a, 82b, and 82c may be connected to one or more voltage measurement devices 30.

For example, crossed-region PHE sensor 80 may include a voltage measurement device 30 that may be connected to two of electrical lead pairs 82a, 82b, and 82c concurrently (e.g., in parallel). Alternatively or in addition, crossed-region PHE sensor 80 may include two voltage measurement devices 30 that may be connected to each of two of electrical lead pairs 82a, 82b, and 82c concurrently. Alternatively or in addition, electrical system 26 of crossed-region PHE sensor 80 may include switching circuitry 27 that may be controlled to alternately switch between different configurations in which each of electrical lead pairs 82a, 82b, or 82c is sequentially connected to electrical current source 28. In each such configuration, one or both of electrical lead pairs 82a, 82b, and 82c that are not connected to electrical current source 28 are connected concurrently to two voltage measurement devices 30, or sequentially or in parallel to a single voltage measurement device 30. Alternatively, electrical system 26 of crossed-region PHE sensor 80 may be configured such that one pair of electrical lead pairs 82a, 82b, or 82c is permanently connected to electrical current source 28, while one or both of the other pairs of electrical lead pairs 82a, 82b, and 82c are permanently connected to one or two voltage measurement devices 30.

For example, with a configuration in which the magnetization in overlap region 84 is parallel to easy magnetic axis 86a, and in the presence of an external magnetic field 24 with a component perpendicular to easy magnetic axis 86a, a PHE voltage may be generated perpendicular to easy magnetic axis 86a. Therefore, a voltage that is measured by a voltage measurement device 30 that is connected to electrical lead pair 82b or to electrical lead pair 82c may be indicative of the component of external magnetic field 24 that is perpendicular to easy magnetic axis 86a. Alternatively or in addition, voltage measurement device 30 may be may be connected to one lead of electrical lead pair 82b and one lead of electrical lead pair 82b (e.g., to reduce the contribution of offset resistance to the measurement).

Similarly, in a configuration where magnetization in overlap region 84 is parallel to easy magnetic axis 86b and external magnetic field 24 has a component perpendicular to easy magnetic axis 86b, a PHE voltage may be measured between any combination of electrical leads of electrical lead pairs 82a and 82c. In a configuration where magnetization in overlap region 84 is parallel to easy magnetic axis 86c and in the presence of an external magnetic field 24 with a component perpendicular to easy magnetic axis 86c, a PHE voltage may be measured between any combination of electrical leads of electrical lead pairs 82a and 82b.

Thus, when electrical system 26 is provided with capability to change the magnetization in overlap region 84, three components of external magnetic field 24, perpendicular to each of easy magnetic axes 86a, 86b, and 86c, may be measured alternately.

One or more configurations of a PHE sensor may be operated to measure two or more components of external magnetic field 24 at a single location using a single PHE sensor. Such configurations may include those of crossed-region PHE sensor 70 (FIG. 5), crossed-region PHE sensor 80 (FIG. 6), or other PHE sensor configurations.

Figure 7:
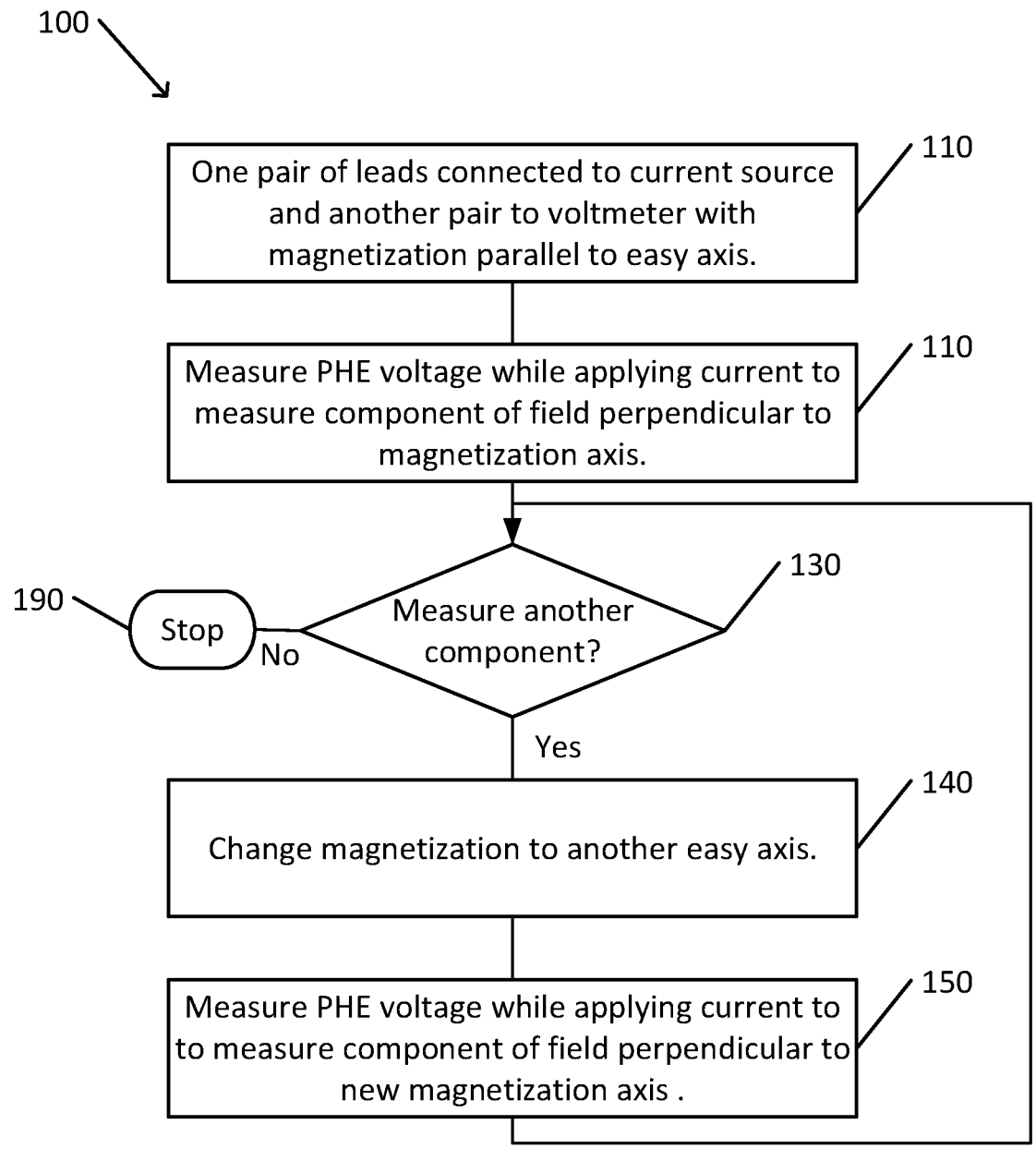
FIG. 7 is a flowchart depicting an example of a method of operating a single PHE sensor to measure multiple components of an external magnetic field at a single location.

FIG. 7 is a flowchart depicting an example of a method of operating a single PHE sensor to measure multiple components of an external magnetic field at a single location.

It should be understood with respect to any flowchart referenced herein that the division of the illustrated method into discrete operations represented by blocks of the flowchart has been selected for convenience and clarity only. Alternative division of the illustrated method into discrete operations is possible with equivalent results. Such alternative division of the illustrated method into discrete operations should be understood as representing other embodiments of the illustrated method.

Similarly, it should be understood that, unless indicated otherwise, the illustrated order of execution of the operations represented by blocks of any flowchart referenced herein has been selected for convenience and clarity only. Operations of the illustrated method may be executed in an alternative order, or concurrently, with equivalent results. Such reordering of operations of the illustrated method should be understood as representing other embodiments of the illustrated method.

Operations of PHE sensor method 100 may be performed automatically, e.g., by a processor 32 of a PHE sensor operating in accordance with programmed instructions, or by an operator operating components of electrical system 26 of a PHE sensor that may be magnetized along two or more easy magnetic axes, e.g., as in overlap region 74 of crossed-region PHE sensor 70 or overlap region 84 of crossed-region PHE sensor 80.

When a magnetization in overlap region 74 or 84 is oriented along one easy magnetic axis (e.g., parallel to one of diagonal easy magnetic axes 76a or 76b or of one of easy magnetic axes 86a-86c), a first pair of leads (e.g., electrical leads 72a, 72b, or 72c, electrical lead pair 82a, 82b, or 82c, or another pair of leads) may be connected to electrical current source 28 while at least one other pair of leads, oriented at a right angle or other oblique angle to the magnetization axis, is connected to voltage measurement device 30 (block 110). For example, the first pair of leads may be parallel (e.g., collinear with) or perpendicular to the axis of magnetization.

Electrical current source 28 may be operated to apply an electrical current to the first pair of leads, while a PHE voltage is measured by the other pair of leads (block 120). The measured PHE voltage may be indicative of the strength of a component of an external magnetic field 24 that is perpendicular to the magnetization axis along one of the easy magnetic axes.

For example, a calibration procedure performed prior to execution of PHE sensor method 100 may relate a measured PHE voltage with a magnetic field strength. Alternatively or in addition, a value of the magnetic field strength may be calculated on the basis of known or measured properties of one or more of an elongated magnetic region 12, or one or more other components of a PHE sensor.

If another component of external magnetic field 24 is to be measured (block 130), switching circuitry 27 may be operated to change a magnetization in overlap region 74 or 84 to another of the easy magnetic axes (block 140). Again, at least one other pair of leads, oriented at a right angle or other oblique angle to the new magnetization, is connected to voltage measurement device 30.

Electrical current source 28 may be operated to apply an electrical current while a PHE voltage is measured by the pair of leads that are arranged perpendicular to, or at an oblique angle to, the direction of magnetization (block 150). The measured PHE voltage may be indicative of the strength of a component of an external magnetic field 24 that is perpendicular to the magnetization axis. A separate calibration measurement or calculation may be required for each configuration.

Different embodiments are disclosed herein. Features of certain embodiments may be combined with features of other embodiments; thus, certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A planar Hall effect (PHE) sensor for measuring at least one component of an external magnetic field, the sensor comprising:
    two elongated magnetic regions, each elongated magnetic region comprising a ferromagnetic material that is magnetized, in the absence of the external magnetic field, along a longitudinal axis along the elongated dimension of the elongated magnetic region, the longitudinal axes of the two magnetic regions being substantially perpendicular to one another, the elongated magnetic regions crossing one another at an overlap region at a midpoint of the longitudinal axis of each of the elongated magnetic regions, the overlap region being characterized by two easy magnetic axes, each easy magnetic axis along a different diagonal between the perpendicular longitudinal axes of the elongated magnetic regions;
    two pairs of electrical leads, each pair connected to the overlap region and aligned along a different easy magnetic axis of said two easy magnetic axes;
    a current source that, when connected to a first pair of said two pairs of electrical leads, is operable to cause a current to flow through the overlap region along a first easy magnetic axis with which the first pair is aligned; and
    a voltage measurement device, when connected to electrical leads of the other pair of said at least two pairs of electrical leads and when the current flows through the overlap region along the first easy magnetic axis, configured to measure a PHE voltage that is generated by a component of the external magnetic field that is perpendicular to the easy magnetic axis along which the overlap region is magnetized.

2. A planar Hall effect (PHE) sensor for measuring at least one component of an external magnetic field, the sensor comprising:
    three magnetic regions, each elongated magnetic region comprising a ferromagnetic material that is magnetized, in the absence of the external magnetic field, along a longitudinal axis along the elongated dimension of the elongated magnetic region, said three elongated magnetic regions crossing one another at an overlap region such that the longitudinal axis of each elongated magnetic region is rotated by substantially equal angles from the longitudinal axes of each of the other two elongated magnetic regions, the elongated magnetic regions crossing one another at a midpoint of the longitudinal axis of each of the elongated magnetic regions, the overlap region being characterized by three easy magnetic axes;

at least two pairs of electrical leads, at least one of the pairs being aligned along one easy magnetic axis of the three easy magnetic axes;

a current source that, when connected to a first pair of said at least two pairs of electrical leads, is operable to cause a current to flow through the overlap region along a first easy magnetic axis with which the first pair is aligned; and a voltage measurement device, when connected to electrical leads of at least one other pair of said at least two electrical leads and when the current flows through the overlap region along the first easy magnetic axis, configured to measure a PHE voltage that is generated by a component of the external magnetic field that is perpendicular to the easy magnetic axis along which the overlap region is magnetized.

3. The sensor of claim 2, wherein said at least two pairs of electrical leads are each aligned along the longitudinal axis of a different elongated magnetic region of each of the elongated magnetic regions.

4. The sensor of claim 1, wherein each of said two elongated magnetic regions is elliptical, the longitudinal axis of each of the elongated magnetic regions being the major axis of that elongated magnetic region.

5. The sensor of claim 1, further comprising a mechanism for changing an orientation of the magnetization of the overlap region from along one easy magnetic axis of said plurality of easy magnetic axes to another easy magnetic axis of said two easy magnetic axes.

6. The sensor of claim 5, wherein the mechanism comprises an electrical conductor that is perpendicular to the longitudinal axis of one of the elongated magnetic regions.

7. A planar Hall effect (PHE) sensor for measuring a component of an external magnetic field, the sensor comprising:

an array of a plurality of elongated magnetic regions, each elongated magnetic region comprising a ferromagnetic material that is magnetized, in the absence of the external magnetic field, along a longitudinal axis along the elongated dimension of the elongated magnetic region, the longitudinal axes of said plurality of elongated magnetic regions being substantially parallel to one another and laterally displaced from one another, each of said plurality of elongated magnetic regions being connected by an electrical conductor to each adjacent elongated magnetic region of the array;

two longitudinal electrical leads, each longitudinal electrical lead connected in common to one end along the longitudinal axis of each elongated magnetic region of the array such that said plurality of elongated magnetic regions are connected in parallel to each of the longitudinal electrical leads;

two lateral electrical leads connected to each of two outside elongated magnetic regions of the array along a lateral axis that is substantially perpendicular to the longitudinal axes such that said plurality of elongated magnetic regions are connected in series to the two lateral electrical leads;

a current source that, when connected to a first pair of leads of either the two longitudinal electrical leads or the two lateral electrical leads, is operable to cause a current to flow through said plurality of elongated magnetic regions along the longitudinal axes; and a voltage measurement device configured to, when connected to another pair of leads of the two longitudinal electrical leads or the two lateral electrical leads and when the current flows through the said plurality of elongated magnetic regions between the first pair of leads, measure a PHE voltage that is generated by a component of the external magnetic field that is perpendicular to the longitudinal axis.

8. The sensor of claim 7, wherein each elongated magnetic region of the array is elliptical, the longitudinal axis of the elongated magnetic region being the major axis of that elongated magnetic region.

9. The sensor of claim 7, wherein the displacements between adjacent elongated magnetic regions of the array are substantially equal.

10. A planar Hall effect (PHE) sensor for measuring one component of an external magnetic field, the sensor comprising:

an elongated magnetic region comprising a ferromagnetic material that is magnetized, in the absence of the external magnetic field, along a longitudinal axis along the elongated dimension of the elongated magnetic region;

two longitudinal electrical leads, each longitudinal electrical lead connected to an end of the elongated magnetic region along the longitudinal axis;

two lateral electrical leads, each lateral electrical lead connected to a side of elongated magnetic region along a lateral axis that is substantially perpendicular to the longitudinal axis;

a current source that, when connected to a first pair of leads of either the two longitudinal electrical leads or the two lateral electrical leads, is operable to cause a current to flow through the elongated magnetic region along an axis of the first pair of leads;

two magnetic flux concentrators positioned on opposite sides of the elongated magnetic region, each magnetic flux concentrator comprising a ferromagnetic material, proximal faces of the magnetic flux concentrators being positioned such that magnetic flux crosses the elongated magnetic region from one of the magnetic flux concentrators to the other in a direction that is substantial perpendicular to the longitudinal axis; and a voltage measurement device configured to, when connected to another pair of leads of either the two longitudinal electrical leads or the two lateral electrical leads, and when the current flows through the first pair of leads, measure a PHE voltage that is generated by a component of the external magnetic field that is perpendicular to the axis of the current and whose magnetic flux is concentrated by the magnetic flux concentrators.

11. The sensor of claim 10, wherein the elongated magnetic region is elliptical, the longitudinal axis being the major axis of the elongated magnetic region.

12. The sensor of claim 10, wherein each magnetic flux concentrator is configured to cause flux that is parallel to the longitudinal axis at a distal face of the magnetic flux concentrator to be directed perpendicular to the longitudinal axis at the proximal face of the magnetic flux concentrator.

13. The sensor of claim 10, wherein each magnetic flux concentrator is configured to cause flux that is perpendicular to both the longitudinal axis and that lateral axis at a distal face of the magnetic flux concentrator to be directed perpendicular to the longitudinal axis and parallel to the lateral axis at the proximal face of the magnetic flux concentrator.

* * * * *